United States Patent [19]
Yamamoto et al.

[11] Patent Number: 5,962,097
[45] Date of Patent: Oct. 5, 1999

[54] PROTECTIVE MEMBER FOR SEMICONDUCTOR WAFER

[75] Inventors: Shoji Yamamoto; Kazuhiko Yamamoto, both of Osaka, Japan

[73] Assignee: Nitto Denko Corporation, Osaka, Japan

[21] Appl. No.: 08/779,894

[22] Filed: Jan. 7, 1997

[30] Foreign Application Priority Data

Jan. 9, 1996 [JP] Japan ..................................... 8-019417

[51] Int. Cl.[6] ........................................................ B32B 7/06
[52] U.S. Cl. ........................... 428/40.1; 283/81; 428/41.3; 428/41.5; 428/41.7; 428/41.8; 428/42.2; 428/42.3; 428/516
[58] Field of Search ................................... 428/40.1, 41.7, 428/41.8, 41.3, 41.5, 42.2, 42.3, 516; 283/81

[56] References Cited

U.S. PATENT DOCUMENTS 3,655,496  4/1972  Ettre ........................................ 428/42.2
5,167,995  12/1992  Johnson ................................. 428/40.1

*Primary Examiner*—Nasser Ahmad
*Attorney, Agent, or Firm*—Sughrue, Mion, Zinn, Macpeak & Seas, PLLC

[57] ABSTRACT

A protective member for a semiconductor wafer wherein a pressure-sensitive adhesive layer formed on a protective film is temporarily adhered to a separator comprising a reinforcing layer and a cover layer, through the cover layer. The separator of the protective member does not require a surface treatment with a release agent and in processing a semiconductor wafer, such as back-surface grinding, the protective film can be automatically peeled and is adhered to the semiconductor wafer via an automatic adhering apparatus to enable the desired processing.

4 Claims, 1 Drawing Sheet

PROTECTIVE MEMBER FOR SEMICONDUCTOR WAFER

FIELD OF THE INVENTION

The present invention relates to a protective member for a semiconductor wafer, wherein the wafer is difficult to be stained with a separator component, and a tape can be peeled from a separator and smoothly adhered to the wafer by an automatic adhering apparatus, and which is suitable for wafer processing such as a back surface grinding treatment, etc.

BACKGROUND OF THE INVENTION

A necessary processing such as a back surface grinding treatment for thinning the wafer as thin as possible is applied to a semiconductor wafer having formed thereon a circuit pattern such as IC. For example, by the back surface grinding treatment, a semiconductor wafer having a thickness of about 0.6 mm is ground to a thickness of from 0.1 to 0.4 mm and is then sent to a subsequent dicing process. In processing a semiconductor wafer, for preventing, for example, the wafer from being injured and also for preventing the circuit pattern-formed surface of the wafer from being stained or injured with grinding trashes, etc., a protective member is previously adhered to the circuit pattern-formed surface of the wafer via an automatic adhering apparatus. After applying necessary processing such as a back surface grinding treatment, etc., the protective member is peeled off, and the semiconductor wafer is sent to a wafer-washing process.

Hitherto, as the protective member, a long separator formed by surface-treating a film of polyester, polypropylene, etc., with a silicone release agent having temporarily adhered thereon protective film pieces each with a definite interval via a pressure-sensitive adhesive layer formed on each protective film piece has been known. However, such a protective member has a problem that when the protective film piece is peeled from the separator, a part of the silicone release agent is transferred and adhered onto the surface of the pressure-sensitive adhesive layer and is then adhered to a semiconductor wafer, staining the circuit pattern-formed surface of the wafer.

To overcome this problem, a protective member using a polyethylene film (JP-A-63-177423) or a stretched polypropylene film (JP-A-6-330005) capable of peeling from a pressure-sensitive adhesive layer without treating with a silicone release agent as the separator is proposed. (The term "JP-A" as used herein means an "unexamined published Japanese patent application".)

However, use of the polyethylene film has a problem that when a protective film is peeled from the separator via an automatic adhering apparatus, elongation of the separator is large and an incorrect action occurs that a part of the protective film is adhered to a semiconductor wafer by a roller, etc., while adhering to the separator, causing the troubles such as the injury of the wafer, etc. Further, use of the stretched polypropylene film also has a problem that the adhesive force to a pressure-sensitive adhesive layer, in particular, an acrylic pressure-sensitive adhesive layer is large, a protective film is adhered to a semiconductor wafer in the state that the stress caused at peeling a protective film from the separator remains in the protective layer, and the stress is added to the wafer at back-surface grinding, causing a warpage of the wafer after grinding.

SUMMARY OF THE INVENTION

Accordingly, objects of the present invention include providing a protective member for a semiconductor wafer such that staining the semiconductor with a separator component is difficult, the peeling treatment of a tape from the separator by an automatic adhering apparatus can be smoothly carried out, the semiconductor wafer can be prevented from being injured by the incorrect action of the adhering treatment of a protective film due to poor peeling of the film from the separator, and defects such as warpage of a semiconductor wafer after the back-surface grinding by the adhesion of a protective film having remained therein the stress caused at peeling from the separator do not occur.

According to the present invention, there is provided a protective member for a semiconductor wafer, comprising:

A) a protective layer,

B) a pressure-sensitive adhesive layer formed on one side of the protective layer, and C) a separator comprising a reinforcing layer and a cover layer formed on at least one side of the reinforcing layer, wherein the separator is temporarily adhered to the pressure-sensitive adhesive layer through the cover layer.

In the protective member of the present invention, the separator having the construction described above does not require a surface treatment with a release agent. Therefore, it is difficult to stain a semiconductor wafer with the separator component, and the protective film can be smoothly peeled from the separator via an automatic adhering apparatus. As a result, the wafer can be prevented from damage due to the incorrect action of the processing line caused by adhering the part of a protective film to the wafer adhered to the separator. Further, since the protective film can be smoothly peeled from the separator, it is difficult for stress to occur and remain in the protective film. Therefore, when the protective film is adhered to the wafer and the wafer is subjected to a back-surface grinding treatment, defects such as warpage of the wafer do not occur. Accordingly, when carrying out wafer processing such as back-surface grinding, the protective film can be automatically peeled from the separator and is adhered to the wafer via an automatic adhering apparatus to apply the desired processing. In this case, the occurrences of staining, injuring, warpage, etc., of the wafer can be prevented.

BRIEF DESCRIPTION OF THE DRAWING

The FIG. 1 is an enlarged cross sectional view showing an embodiment of the protective member for a semiconductor wafer of the present invention.

DETAILED DESCRIPTION OF THE INVENTION

Figure 1:
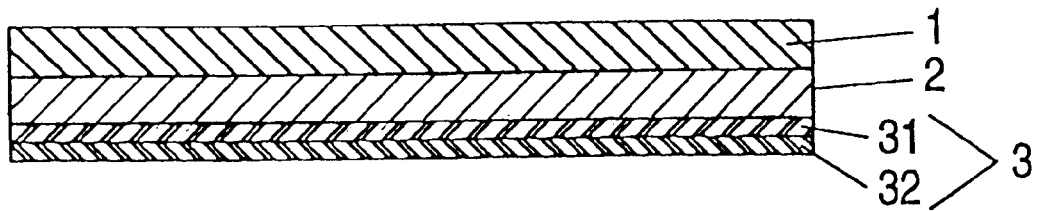

The present invention is described in detail below.

In the protective member of the present invention, the pressure-sensitive adhesive layer formed on one side of the protective film is temporarily adhered to the separator comprising a reinforcing layer having formed on at least one side thereof a cover layer, through the cover layer. The protective member is for protecting a semiconductor wafer by peeling the protective film from the separator and adhering to the semiconductor wafer.

One embodiment of the protective member of the present invention is shown in the FIGURE. In the FIGURE, a protective film 1 has a pressure-sensitive adhesive layer 2 formed on one side thereof, and the pressure-sensitive adhesive layer 2 is temporarily adhered to a separator 3 comprising a cover layer and a reinforcing layer 32, through the cover layer 31.

The separator has a function of protecting the pressure-sensitive adhesive layer by temporarily adhering to the pressure-sensitive adhesive layer until adhering the protective layer to a semiconductor wafer for the purpose of preventing the pressure-sensitive adhesive layer from being stained in preserving and distributing the protective member. The separator also has a function as a carrier tape in supplying the protective film to a wafer processing line via an automatic adhering apparatus.

The separator which can be used is, for example, a separator comprising a reinforcing layer having formed on at least one side thereof the cover layer 31 comprising a polyethylene, as shown in the FIGURE. By temporarily adhering the pressure-sensitive adhesive layer to the separator via such a cover layer, a separator which can be easily peeled from the pressure-sensitive adhesive layer can be formed without treating the surface of the cover layer with a silicone release agent. This makes it possible to prevent that a part of the coating layer of a release agent transfers to the pressure-sensitive adhesive layer and further transfers to a semiconductor wafer, thus forming a staining material.

There is no particular restriction on the polyethylene for forming the cover layer, and an appropriate polyethylene such as a straight chain polyethylene, a low-density polyethylene, an intermediate-density polyethylene, or a high-density polyethylene can be used.

The cover layer can be formed as a single layer of polyethylene or a layer composed of a blend of polyethylene and a different kind of a polymer. The polyethylene or the polyethylene blend can be compounded with additives.

When the polyethylene blend is used as the cover layer, the content of polyethylene is at least 50% by weight, preferably at least 65% by weight, and more preferably from 60 to 95% by weight, based on the weight of the blend from the point of maintaining good releasability. When compounding with additives, the content of low-molecular weight additives such as a lubricant, an antioxidant, or a pigment is 5 parts by weight or less per 100 parts by weight of polyethylene, in particular, 5 parts by weight or less, and preferably from 0.01 to 4 parts by weight, per 100 parts by weight of the total polymers forming the cover layer, from the point of preventing that the additives transfer to the pressure-sensitive adhesive layer and further transfer to a semiconductor wafer to become staining materials.

As the different kind of polymers for the blend, one or more kinds of appropriate polymers can be used according to the blending purposes, for example, the improvement of the adhesion of the cover layer with other layer such as a reinforcing layer in the multilayer substrate, and the improvement of the release property from the pressure-sensitive adhesive layer.

Examples of the blending polymers for improving the adhesion include polypropylene, polybutene, polymethylpentene, polyester, polycarbonate, polyethylene, polyurethane, polyamide, an epoxy resin, polyvinyl chloride, an ethylenevinyl acetate copolymer, polyvinyl acetate, an ethylene(meth)acrylate copolymer, an ethylene-methyl (meth)acrylate copolymer, an ethylene-ethyl (meth) acrylate copolymer, other acrylic polymer, and an ethylene-propylene copolymer.

Examples of the blending polymers for improving the release property include a silicone polymer or a fluorine polymer each containing Si, F, etc., in the molecule, a polymer obtained by grafting polyethylene onto the above silicone polymer or fluorine polymer, and a long-chain alkyl type acrylic polymer such as a (meth)acrylic acid alkyl ester polymer having an alkyl group of at least 8 carbon atoms.

Examples of the lubricant which may be added to the cover layer are fatty acids such as stearic acid, and fatty acid amides such as stearic acid amide, palmitic acid amide, methylenebisstearoamide, or ethylenebisstearoamide.

Examples of the antioxidant are substituted monophenol compounds such as 2,6-di-t-butyl-p-cresol, n-octadecyl-$\beta$-(4-hydroxy-3,5-di-t-butylphenyl) propionate, or an alkylphenol; alkylidenebisphenol compounds such as 2,2'-methylenebis(4-methyl-6-t-butylphenol), 4,4'-butylidenebis(3-methyl-6-t-butylphenol), or 4,4'-i-propylidenebisphenol; polyphenol compounds such as 1,3,5-trimethyl-2,4,6-tris(3,5-di-t-butyl-4-hydroxybenzyl)benzene, tetrakis[3-(4-hydroxy-3,5-di-t-butylphenyl)propionyloxymethyl] methane, or tris(2-methylhydroxy-5-t-butylphenyl)butane; thiobisphenol compounds such as 4,4'-thiobis(6-t-butyl-o-cresol); and thiopropionic acid ester compounds such as dilauryl thiodipropionate, or distearyl thiodipropionate.

Examples of the pigment are inorganic pigments such as calcium carbonate, titania, carbon black, molybdenum red, Titan Yellow, or cobalt blue; phthalocyanine pigments such as phthalocyanine blue, or phthalocyanine green; quinacridone pigments such Cinquasia Red, etc.; azo pigments such as Lake Red, Benzidine Orange, Benzidine Yellow, Hansa Yellow, or Green Gold; and threne pigments such as Indanthrene Scarlet, Indanthrene Orange, Indanthrene Blue, Indanthrene Violet, or Antheaaminopyrimidine Yellow.

The separator comprises a reinforcing layer having a cover layer formed on at least one side thereof. The reinforcing layer has a 1% modulus of at least $3N/mm^2$, preferably at least $5N/mm^2$, and more preferably at least 8 $N/mm^2$, from the point of preventing the occurrence of poor peeling from the separator by the elongation, etc., of the separator, as shown in the drawing.

Examples of such a reinforcing layer are layers comprising the films of blending polymers described above, papers, and metal foils.

The separator can be formed by an appropriate method such as a dry laminating method, an extrusion laminating method, a multilayer extrusion method, or a solution coating or impregnation method.

The thickness of the separator can be appropriately determined according to the purpose of use, etc. However, in the embodiment of the present invention, after being peeled from the protective member, the separator is usually wasted even if there is a possibility of reusing. Therefore, the total thickness of the separator is generally from 10 to 500 $\mu$m, preferably from 20 to 200 $\mu$m, and more preferably from 30 to 150 $\mu$m, from the points of the economy, and the strength of the separator. The thickness of each layer such as the cover layer in the separator is at least 3 $\mu$m, preferably at least 5 $\mu$m, and more preferably at least 10 $\mu$m, from the points of the strength, the layer characteristics, etc.

The content of low molecular weight additives such as a lubricant, an antioxidant, a pigment, etc., in the reinforcing layer is optional, and can be appropriately determined according to the purpose of use, etc.

The protective film aims at the shock relaxation in processing semiconductor wafers. The protective film which is preferably used is a film having a good water resistance for preventing the protective film from becoming difficult to peel by the permeation of washing water, etc. Examples of the protective film are films each comprising each of the plastics shown as the polymers for the blend of the cover layer described above and having a thickness of from 5 to 500 $\mu$m, and preferably from 10 to 300 $\mu$m.

A protective film having a good deformation property comprising a plastic enriched in the rubber elasticity, such as an ethylene-vinyl acetate copolymer, an ethylene-(meth)

acrylate copolymer, an ethylene-methyl (meth)acrylate copolymer, an ethylene-ethyl (meth) acrylate copolymer, or an ethylene-propylene copolymer, is advantageously used for forming the protective member having excellent adhesion to a rough surface and also having excellent protecting function of a semiconductor wafer.

On the other hand, the protective film having a nerve, such as polypropylene, polyester, or polycarbonate, is difficult to cause a poor adhesion such as a curved adhesion (exposure of the circuit pattern) when automatically adhering the protective member to a circuit pattern-formed surface of a semiconductor wafer, and therefore is advantageous to form the protective member for use in an automatic adhering apparatus.

The pressure-sensitive adhesive layer is for adhering the protective film to the circuit pattern-formed surface of a semiconductor wafer and sealing the surface. Accordingly, for the formation of the pressure-sensitive adhesive layer, an appropriate acrylic or rubber pressure-sensitive adhesive can be used. In particular, an acrylic pressure-sensitive adhesive comprising an acrylic polymer as the main component is preferably used from the points of the adhesive property to a semiconductor wafer and a cleaning and washing property of a semiconductor wafer with a super pure water or a proper organic solvent such as an alcohol after peeling the protective film.

Examples of the acrylic polymer are polymers comprising one or more kinds of acrylic acid esters or methacrylic acid esters each having a straight chain or branched alkyl group having 30 or less carbon atoms, and preferably from 4 to 18 carbon atoms, such as a methyl group, an ethyl group, a propyl group, an isopropyl group, an n-butyl group, a t-butyl group, an isobutyl group, an amyl group, an isoamyl group, a hexyl group, a heptyl group, a cyclohexyl group, a 2-ethylhexyl group, an octyl group, an isooctyl group, a nonyl group, an isononyl group, a decyl group, an isodecyl group, a undecyl group, a lauryl group, a tridecyl group, a tetradecyl group, a stearyl group, an octadecyl group, or a dodecyl group.

Examples of monomers other than the above-described monomers, which can form the above polymer are carboxyl group-containing monomers such as acrylic acid, methacrylic acid, carboxy acrylate, carboxypentyl acrylate, itaconic acid, maleic acid, fumaric acid, or crotonic acid; acid anhydride monomers such as maleic anhydride, or itaconic anhydride; hydroxyl group-containing monomers such as 2-hydroxyethyl (meth)acrylate, 2-hydroxypropyl (meth) acrylate, 4-hydroxybutyl (meth)acrylate, 6-hydroxyhexyl (meth)acrylate, 8-hydroxyoctyl (meth)acrylate, 10-hydroxydecyl (meth)acrylate, 12-hydroxylauryl (meth) acrylate, or (4-hydroxymethylmethylcyclohexyl) methylmethyl acrylate; sulfonic acid group-containing monomers such as styrenesulfonic acid, allylsulfonic acid, 2-(meth) acrylamido-2-methylpropanesulfonic acid, (meth) acrylamidopropanesulfonic acid, sulfopropyl (meth) acrylate, or (meth)acryloyloxynaphthalenesulfonic acid; and phosphoric acid group-containing monomers such as 2-hydroxyethylacryloyl phosphate.

Examples of a monomer copolymerizable with the acrylic monomer are (N-substituted)amide monomers such as (meth)acrylamide, N,N-dimethyl(meth)acrylamide, N-butyl (meth)acrylamide, N-methylol(meth)acrylamide, or N-methylolpropane(meth)acrylamide; (meth)acrylic acid alkylaminoalkyl monomers such as aminoethyl (meth) acrylate, N,N-dimethylaminoethyl (meth)acrylate, or t-butylaminoethyl (meth)acrylate; alkoxyalkyl (meth)acrylic acid monomers such as methoxyethyl (meth)acrylate, or ethoxyethyl (meth)acrylate; maleimide monomers such as N-cyclohexylmaleimide, N-isopropylmaleimide, or N-laurylmaleimide, N-phenylmaleimide; itaconimide monomers such as N-methylitaconimide, N-ethylitaconimide, N-butylitaconimide, N-octylitaconimide, N-2-ethylhexylitaconimide, N-cyclohexylitaconimide, or N-laurylitaconimide; and succinimide monomers such as N(meth) acryloyloxymethylenesuccinimide, N-(meth)acryloyl-6-oxyhexamethylenesuccinimide, or N-(meth)acryloyl-8-oxyictamethylenesuccinimide.

Further examples of the monomer which may be copolymerized are vinyl monomers such as vinyl acetate, vinyl propionate, N-vinylpyrrolidone, methylvinylpyrrolidone, vinylpyridine, vinylpiperidone, vinylpyrimidine, vinylpiperazine, vinylpyrazine, vinylpyrrole, vinylimidazole, vinyloxazole, vinylmorpholine, N-vinylcarboxylic acid amides, styrene, α-methylstyrene, or N-vinylcaprolactam; cyano acrylate monomers such as (meth)acrylonitrile; epoxy group-containing acrylic monomers such as glycidyl (meth)acrylate; glycol acrylic acid ester monomers such as polyethylene glycol (meth)acrylate, polypropylene glycol (meth)acrylate, methoxyethylene glycol (meth)acrylate, or methoxypolypropylene glycol (meth) acrylate; and acrylic acid ester monomers such as tetrahydrofurfuryl (meth)acrylate, fluorine (meth)acrylate, silicone (meth)acrylate, or 2-methoxyethyl acrylate.

Those monomers may be used according to the need for the purpose of modifying adhesive properties and the like. The amount of the monomer used is preferably 50 parts by weight or less per 100 parts by weight of the acrylic acid alkyl ester.

If required and necessary, functional monomers may be used as the monomer component for copolymerization for the purpose of, for example, crosslinking treatment of acrylic polymers. Examples of the monomer are hexanediol di(meth)acrylate, (poly)ethylene glycol di(meth)acrylate, (poly)propylene glycol di(meth)acrylate, neopentyl glycol di(meth)acrylate, pentaerythritol di(meth)acrylate, trimethylol propane tri(meth)acrylate, pentaerythritol tri(meth) acrylate, dipentaerythritol hexa(meth)acrylate, epoxy acrylate, polyester acrylate, and urethane acrylate.

One or more kinds of polyfunctional monomers can be used, and the amount thereof used is preferably 30% by weight or less of the total monomers from the point of the pressure-sensitive adhesive characteristics.

The acrylic polymer can be prepared by, for example, applying an appropriate method such as a solution polymerization method, a bulk polymerization method, or a suspension polymerization method to a mixture of one or more kinds of component monomers.

The pressure-sensitive adhesive layer preferably has a composition wherein inclusion of low molecular weight materials is suppressed from the point of preventing staining of a semiconductor wafer. For this reason, the composition preferably comprises an acrylic polymer having a number average molecular weight of at least 300,000, and preferably from 400,000 to 3,000,000. Therefore, the pressure-sensitive adhesive layer can be an appropriately crosslinked type by an internal crosslinking method, an external crosslinking method, or the like.

The internally crosslinked acrylic polymer can be prepared by, for example, a copolymerization method using the above-described polyfunctional monomer components or a polymerization method by irradiation with ultraviolet rays, electron rays, etc. On the other hand, the external crosslinking can be carried out by a method of compounding the pressure-sensitive adhesive with an intermolecular crosslinking agent. Examples of the intermolecular crosslinking agent are a polyfunctional isocyanate crosslinking agent, an epoxy crosslinking agent, a melamine resin crosslinking agent, a metal salt crosslinking agent, a metal chelate crosslinking agent, an amino resin crosslinking agent, and a peroxide crosslinking agent. The intermolecular crosslinking agent can be properly used according to the kind of the crosslinkable functional group in the acrylic polymer, etc., and there is no particular restriction on such an intermolecular crosslinking agent.

The protective member of the present invention can be formed by an appropriate method such as a method of forming the pressure-sensitive adhesive layer on the protective film by a method in accordance with a pressure-sensitive adhesive tape-forming method such as a method of coating a pressure-sensitive adhesive to a protective film and heat-treating the same, and temporarily adhering a separator to the pressure-sensitive layer to cover the layer, or a method of using a long carrier tape as the separator and temporarily adhering pressure-sensitive adhesive tape-attached protective films of a definite form to the carrier tape at predetermined intervals. In this case, in the present invention, the pressure-sensitive adhesive layer can also be formed while preparing the acrylic polymer by a bulk polymerization by irradiation with a radiation such as ultraviolet rays.

For example, the pressure-sensitive adhesive layer-forming method described above is where a mixture of radiation-curing type component monomers is coated on a protective film, and a pressure-sensitive adhesive layer is formed while preparing an acrylic polymer by a method of subjecting the coated layer to a polymerization treatment by irradiation with radiation. The radiation-curing type pressure-sensitive adhesive layer has the advantage that after attaining the purpose of protecting a semiconductor wafer by forming thereon the pressure-sensitive adhesive of the state showing the pressure-sensitive adhesive characteristics according to the purpose of use, etc., by an initial radiation-irradiation treatment, in peeling the protective member, an irradiation treatment by ultraviolet rays, etc., is applied again to proceed the cured state of the pressure-sensitive adhesive layer, whereby facilitating peeling of the protective member from the wafer by reducing or losing the adhesive force of the pressure-sensitive adhesive layer. The radiation-curing type pressure-sensitive adhesive layer can also be formed as a type of being curing treated by the irradiation of ultraviolet rays, etc., at peeling the protective film after finishing the processing purpose of a semiconductor wafer, by forming a pressure-sensitive adhesive layer containing a radiation curing component, composed of monomers, oligomers, polymers, etc., and adhering the pressure-sensitive adhesive layer in an uncured state to the semiconductor wafer.

In the mixture of the radiation-curing type component monomers described above, the examples of a photopolymerization initiator which may be compounded where employing the curing method by ultraviolet rays, etc., are acetophenone compounds such as 4-(2-hydroxyethoxy) phenyl (2-hydroxy-2-propyl) ketone, α-hydroxy-α,α'-dimethylacetophenone, methoxyacetophenone, 2,2-dimethoxy-2-phenylacetophenone, 2,2-diethoxyacetophenone, 1-hydroxycyclohexyl phenyl ketone, or 2-methyl-1-4-(methylthio)phenyl]-2-morpholinopropane-1; benzoin ether compounds such as benzoin ethyl ether, benzoin propyl ether, or anizoin methyl ether; α-ketol compounds such as 2-methyl-2-hydroxypropiophenone; ketal compounds such as benzyl dimethyl ketal; aromatic sulfonyl chloride compounds such as 2-naphthalenesulfonyl chloride; photoactive oxime compounds such as 1-phenone-1,1-propanedione-2-(o-ethoxycarbonyl)oxime; benzophenone compounds such as benzophenone, benzoylbenzoic acid, or 3,3'-dimethyl-4-methoxybenzophenone; thioxanthone compounds such as thioxanthone, 2-chlorothioxanthone, 2-methylthioxanthone, 2,4-dimethylthioxanthone, isopropylthioxanthone, 2,4-dichlorothoxabthone, 2,4-diethylthioxanthone, or 2,4-diisopropylthioxanthone; camphorquinone, halogenated ketones, acyl phosphinoxide, acyl phosphonate, etc.

The thickness of the pressure-sensitive adhesive layer may be appropriately determined, but is generally 300 μm or less, preferably from 3 to 200 μm, and more preferably from 5 to 100 μm.

The adhesive force of the pressure-sensitive adhesive layer may be appropriately determined according to the purpose of use, etc. In general, from the points of the adhesive property to a semiconductor wafer and the peeling property from the wafer, the adhesive force is 2,000 g/20 mm or less, preferably from 10 to 1,500 g/20 mm, and more preferably from 15 to 1,000 g/20 mm, based on the adhesive force (normal temperature, 180° peeling value, peeling speed 300 mm/minute) to a stainless steel plate (SUS 304 BA).

The protective member of the present invention can be adhered to the circuit pattern-formed surface of a semiconductor wafer, etc., in a proper form. The protective member may previously be formed in the form corresponding to the surface form of a semiconductor wafer. From the point of applicability to an automatic adhering apparatus, it is preferred for the protective member of the present invention to be in the state that pressure-sensitive adhesive layer-attached protective films each having such a definite form are temporarily adhered to a long separator at a definite interval.

The protective member may have an antistatic capacity for preventing the generation of static electricity at adhering and peeling the protective member and also for preventing the circuit of the semiconductor wafer from being broken by electrostatic charging caused thereby. The antistatic capacity can be imparted by an appropriate method such as the addition of an antistatic agent or a conductive agent to the protective film or the pressure-sensitive adhesive layer, or formation of a conductive layer comprising a charge transfer complex, a metal-deposited layer, etc., on the protective film. In this case, the method wherein it is difficult to generate impurity ions which may modify the semiconductor wafer is preferred. Also, since static electricity generates at adhering and peeling the separator, a conductive layer may be formed on the separator to prevent the generation of the static electricity. The conductive layer may be formed by an appropriate means such as a metal foil, or a metal-deposited layer.

The present invention is described in more detail by reference to the following examples and comparative examples, but it should be understood that the invention is not construed as being limited thereto. Unless otherwise indicated, all parts, percents, ratios and the like are by weight.

EXAMPLE 1

Three parts of a polyisocyanate crosslinking agent was added to a solution containing 100 parts of an acrylic polymer having a number average molecular weight of 800,000 formed by copolymerizing 95 parts of butyl acrylate and 5 parts of acrylic acid in an ethyl acetate by the conventional method to obtain a solution of an acrylic pressure-sensitive adhesive. The solution was coated on a corona-treated surface of an ethylene-vinyl acetate copolymer film having a thickness of 100 μm, and crosslinked by heating at 80° C. for 10 minutes to form a pressure-sensitive adhesive layer having a dry thickness of 20 μm. The film having the pressure-sensitive adhesive layer was cut into definite forms, and they were temporarily adhered to a cover layer of a long separator via the pressure-sensitive layer at a definite interval to obtain a protective member.

The separator used above was prepared by extrusion laminating a 20 μm thick cover layer having a 1% modulus of 2.5 N/mm$^2$ and composed of polyethylene containing about 1 part of additives (a lubricant, an antioxidant, a pigment, etc.) per 100 parts of the polyethylene on a 30 μm thick reinforcing layer having a 1% modulus of 14N/mm$^2$ and composed of a polyester film.

The 1% modulus used herein was obtained by sampling in the flowing direction (MD) with a width of 10 mm from the film of the same composition and measuring the sample under the conditions of a zipper interval of 50 mm and a tensile speed of 50 mm/minute.

EXAMPLE 2

The same procedure as in Example 1 was followed except that a separator composed of a 10 μm thick cover layer having a 1% modulus of 2.5N/mm$^2$ and composed of polyethylene containing about 1 part of the additives per 100 parts of the polyethylene laminated on both surfaces of a 30 μm thick reinforcing layer having a 1% modulus of 5N/mm$^2$ and composed of a polypropylene layer, the separator being formed by a three-layer extrusion method, was used as the separator, to obtain a protective member.

EXAMPLE 3

The same procedure as in Example 1 was followed except that a separator composed of a 20 μm thick cover layer having a 1% modulus of 4N/mm$^2$ and composed of a blend of 55 parts of polyethylene containing about 1 part of the additives per 100 parts of the polyethylene and 45 parts of polypropylene containing about 1 part of the additives laminated on a reinforcing layer composed of a 30 μm thick polypropylene layer having a 1% modulus of 5N/mm$^2$, the separator being formed by a double layer extrusion method, was used as the separator, to obtain a protective member.

COMPARATIVE EXAMPLE 1

The same procedure as in Example 1 was followed except that a separator obtained by extrusion laminating a 20 μm thick cover layer having a 1% modulus of 2.4N/mm$^2$ and composed of polyethylene containing about 6 parts of the additives per 100 parts of the polyethylene on a 30 μm thick reinforcing layer having a 1% modulus of 14N/mm$^2$ and composed of polyester was used as the separator, to obtain a protective member.

COMPARATIVE EXAMPLE 2

The same procedure as in Example 1 was followed except that a 60 μm thick single layer film having a 1% modulus of 2.5 N/mm$^2$ and composed of polyethylene containing about 1 part of the additives per 100 parts of the polyethylene was used as the separator, to obtain a protective member.

COMPARATIVE EXAMPLE 3

The same procedure as in Example 1 was followed except that a 50 μm thick single layer having a 1% modulus of 15N/mm$^2$ and composed of polypropylene containing about 1 part of the additives per 100 parts of the polypropylene was used as the separator, to obtain a protective member.

COMPARATIVE EXAMPLE 4

The same procedure as in Example 1 was followed except that a 50 μm thick polyester film having a 1% modulus of 14 N/mm$^2$ and surface-treated with a silicone release agent was used as the separator, to obtain a protective member.

Evaluation Tests

The following properties were determined on each of the protective members obtained in the above examples and comparative examples.

Adhesion:

Each separator having a size of 10 cm×10 cm was immersed in toluene of 50° C. for 5 minutes and occurrence of interlaminar separation was determined.

Peeling Property:

The protective film in each protective member sampled in the flowing direction with a width of 50 mm was fixed to a stainless steel plate having a sparingly deforming property with a double-sided pressure-sensitive adhesive tape, and the force required to peel the separator from the pressure-sensitive adhesive layer in the protective member was determined (180° peeling, peeling speed 300 mm/minute, 23° C.).

Number of Particles:

In a clean room, the separator was peeled from each protective member, the protective member was adhered to a 4 inch mirror wafer via the pressure-sensitive adhesive layer, after allowing to stand them for one hour, the protective member was peeled from the mirror wafer, and the number of particles having sizes of 0.28 μm or larger on the mirror wafer was determined by a laser surface detector (LS-5000, trade name, manufactured by Hitachi Denshi Engineering K.K.). Automatic Adhesive Property (Application miss):

Each protective member having a width of 180 mm and a length of 100 meters wound around a polyvinyl chloride core was mounted on an automatic adhering apparatus (DR-8500II, trade name, manufactured by Nitto Seiki K.K.), the protective members were peeled from the separator and adhered to a 6 inch mirror wafer by automatic operation, the operation was continuously practiced about 500 pieces, and the number of causing the adhesion miss at the operation was determined.

Warpage:

A back surface grinding treatment for decreasing the thickness of 0.6 mm to 0.25 mm was applied to the 6 inch mirror wafer having adhered thereto the protective member described above, and the occurrence of a warpage was determined.

The results obtained are shown in the Table below.

TABLE

|  | Example | | | Comparative Example | | | |
| --- | --- | --- | --- | --- | --- | --- | --- |
|  | 1 | 2 | 3 | 1 | 2 | 3 | 4 |
| Adhesive Property (interlaminar adhesive force) | Good | Good | Excellent | Good | — | — | — |

TABLE-continued

| | Example | | | Comparative Example | | | |
|---|---|---|---|---|---|---|---|
| | 1 | 2 | 3 | 1 | 2 | 3 | 4 |
| Peeling Property (g/50 mm) | 60 | 60 | 120 | 55 | 60 | 250 | 10 |
| Particle Number (Number/ 4 inches) | 8 | 8 | 12 | 100 | 9 | 40 | 500 |
| Application Miss (Number/ 500) | 0 | 0 | 0 | 0 | 350 | 0 | 0 |
| Warpage (back surface grinding) | None | None | None | None | None | Observed | None |

It can be seen from the results shown in the above Table that by the protective members of the present invention, the semiconductor wafer is difficult to be contaminated with the separator component, the protective film can be smoothly peeled from the separator and can adhere to the semiconductor wafer and protect it via an automatic adhering apparatus, and it is difficult to cause damage and to the wafer. Additionally, it can be seen that in the protective members of Comparative Examples 1 and 4, the semiconductor wafer is greatly contaminated with the separator component. In the protective members of Comparative Examples 2 and 3, the wafer is greatly damaged by poor peeling of the separator in the adhering treatment via an automatic adhering apparatus or warpage is liable to occur in the wafer by the back surface grinding treatment.

While the invention has been described in detail and with reference to specific embodiments thereof, it will be apparent to one skilled in the art that various changes and modifications can be made therein without departing from the spirit and scope thereof.

What is claimed is:

1. A semiconductor wafer protective member comprising:

A) a semiconductor wafer protective layer,

B) a pressure-sensitive adhesive layer formed on one side of the protective layer, and C) a separator comprising a reinforcing layer and a cover layer formed on at least one side of the reinforcing layer, wherein the separator is temporarily adhered to the pressure-sensitive adhesive layer through the cover layer; and wherein the cover layer a homopolymer of comprises polyethylene.

2. The protective member of claim 1, wherein the cover layer comprises a blend of said polyethylene and at least one member of polypropylene and polybutene in an amount of not more than the equivalent amount of polyethylene.

3. The protective member of claim 1, wherein the cover layer contains low molecular weight additives in an amount of 5 parts by weight or less per 100 parts by weight of polyethylene.

4. The protective member of claim 1, wherein the reinforcing layer has a 1% modulus of at least $3N/mm^2$.

* * * * *